United States Patent [19]

Bernardo et al.

[11] 3,710,479

[45] Jan. 16, 1973

[54] COMPONENT INSERTION APPARATUS

[75] Inventors: Edward T. Bernardo, Endicott, N.Y.; Joseph G. Cherochak, Jessup, Pa.; Richard G. Sipel, Endwell, N.Y.

[73] Assignee: International Business Machines Corporation, Armonk, N.Y.

[22] Filed: March 1, 1971

[21] Appl. No.: 119,640

[52] U.S. Cl..................................29/203 B, 29/211 R

[51] Int. Cl...........................H05k 13/04, B23q 7/10

[58] Field of Search...53/59 R; 29/203 B, 203 R, 211 R, 29/203 DT, 626, 203 D, 211 D, 211 L, 211 M, 206, 208 R; 221/293

[56] References Cited

UNITED STATES PATENTS

| | | | |
|---|---|---|---|
| 3,523,352 | 8/1970 | Hayunga | 29/203 B |
| 3,528,160 | 9/1970 | Wadleigh | 29/203 B |
| 1,383,623 | 7/1921 | Groves | 53/59 R |
| 2,658,199 | 11/1953 | Ayers | 221/293 |
| 3,327,375 | 6/1967 | Reijnhard et al | 29/211 R X |

*Primary Examiner*—Thomas H. Eager

*Attorney*—Hanifin & Jancin and Kenneth P. Johnson

[57] ABSTRACT

Apparatus for releasing multi-lead components singly from each of a plurality of magazines and directing the released set of components to predetermined groups of perforations in a circuit panel for insertion of the component leads. Magazines can be readily moved to different positions on the panel to facilitate the assembly of various circuit arrangements, and the circuit panel to receive the components is moved to such a position by the component dispensing mechanism at the time the set of components is to be released from the respective magazines.

10 Claims, 4 Drawing Figures

INVENTORS
EDWARD T. BERNARDO
JOSEPH G. CHEROCHAK
RICHARD G. SIPEL

BY K. P. Johnson
ATTORNEY

COMPONENT INSERTION APPARATUS

BACKGROUND OF THE INVENTION

Considerable effort has been spent in devising various mechanical techniques to assemble electrical components on printed circuit panels. The miniaturization of components requires closely held tolerances in the devices to enable assembly, and the use of costly integrated circuit chips or modules as components makes careful, accurate handling a necessity in order to minimize scrapped or damaged units. Occasional hand operations are frequently required to prevent excessive scrap in certain procedures. This is particularly true of components having fragile leads which can easily become bent or broken.

Several devices have been designed to mechanize component insertion. One approach has been to use a pre-assembly tray which is first filled with a complement of inverted components and then has a circuit panel placed over the component leads. This requires an additional operational step in not directly inserting the components in the panel. Other devices have used mechanical arms and holders to grasp and insert the components. In order to attain the required accuracy, an intricate and complex control device is necessary which adds to the assembly cost. Another approach has been to use relatively long pneumatic tubes to direct selected components to the panel. With this approach, components can become damaged by impact at the panel if misaligned; and when components are small, maintenance of proper orientation within the tube is difficult.

Accordingly, a primary object of this invention is to provide insertion apparatus with which components having preformed leads are inserted in respective circuit panel locations more reliably and accurately than heretofore possible.

Another important object of this invention is the provision of apparatus for inserting multi-lead components in a circuit panel which is simple in design and operation, and is inexpensive to construct.

A further object of this invention is the provision for electrical component insertion apparatus for circuit panels in which the panel location and component insertion are related by inter-dependent mechanisms.

A still further object of this invention is the provision of apparatus for inserting electrical components in circuit panels which provides ready access to components and panels in the event of servicing.

Yet another object of this invention is the provision of apparatus for inserting multiple electrical components in a circuit panel in a single cycle of operation and which also permits easy location changes of component supply magazines to accommodate several types of circuit panels.

SUMMARY OF THE INVENTION

The foregoing objects are obtained in accordance with the invention by providing means for supporting a plurality of component magazines over movable registration means for the circuit panel which is to receive the components and having, intermediate the magazine support means and registration means, component dispensing means for singly releasing components from each magazine, and guide means for directing the released component to the desired location.

The magazine support means is constructed to permit loaded magazines to be inserted and held at selected ones of a plurality of locations over a circuit panel. After insertion of a panel in the registration means, the panel is moved to a component-receiving position by actuation of the dispensing means. Components then fall freely into the perforations within the panel. Upon completion of the dispensing cycle, the panel is returned to its original inserted position from which is can be removed.

The insertion apparatus has the important features of high density component placement, magazines easily positionable as required about the surface of the panel, and use of a variable number of magazines without change in the remaining mechanisms. Potential insertion damage is minimized by placing the magazines near to the panel and closely guiding the component in its movement to the panel. The apparatus of the invention has the additional feature of a readily operable release device for the panel registration means to allow movement of the panel and its support to a position allowing operator access to the guide means and dispensing means in the event servicing is required.

The foregoing and other objects, features and advantages of the invention will be apparent from the following more particular description of a preferred embodiment of the invention, as illustrated in the accompanying drawings.

DESCRIPTION OF THE PREFERRED EMBODIMENT

Figures 1, 3, 4:
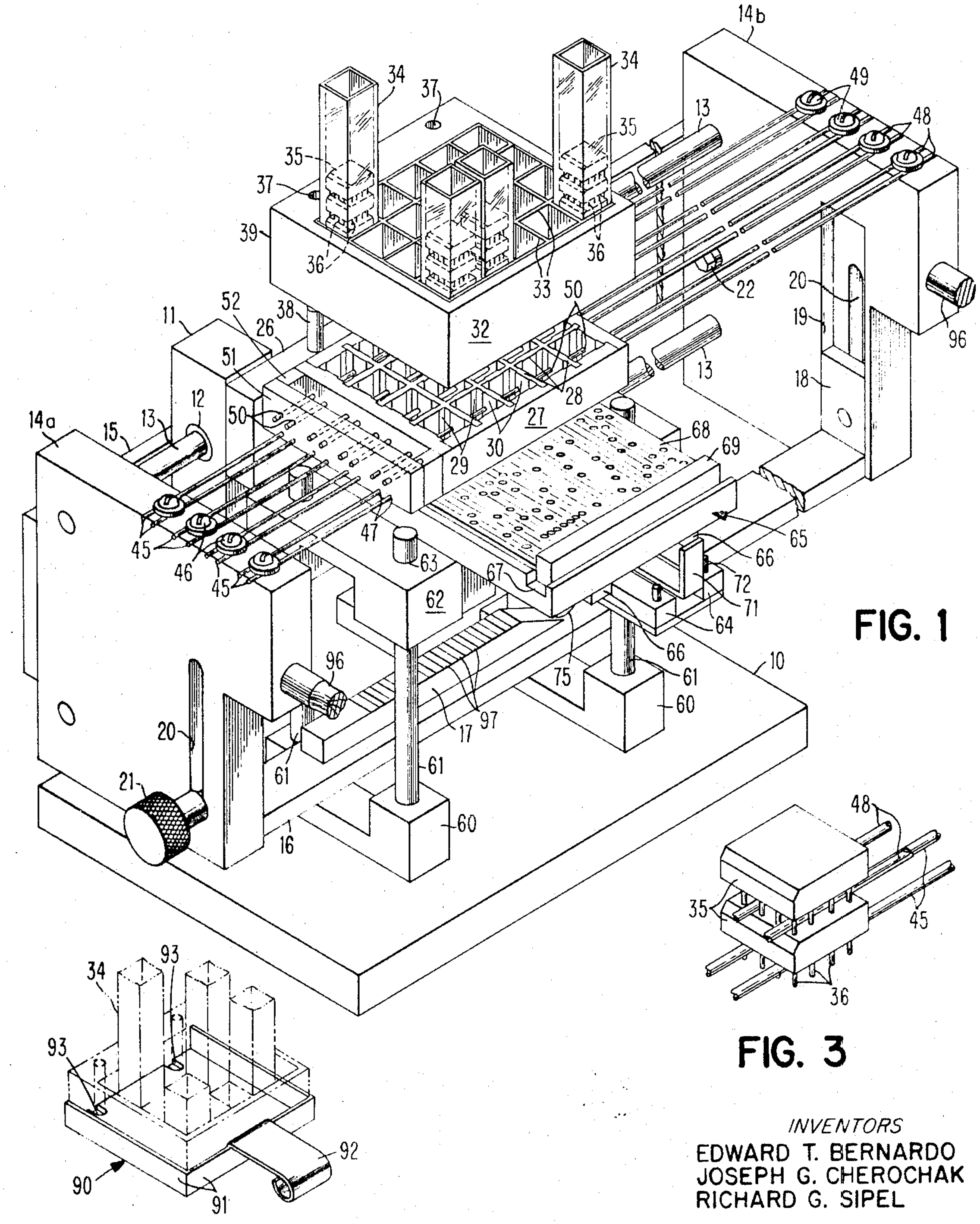
FIG. 1 is a perspective view of the component insertion apparatus, partially exploded, constructed in accordance with the principles of the invention.
FIG. 3 is a perspective view of a component showing the manner of support prior to release.
FIG. 4 is a perspective view of an auxiliary device to aid in loading magazines in the apparatus of FIG. 1.
Figure 2:
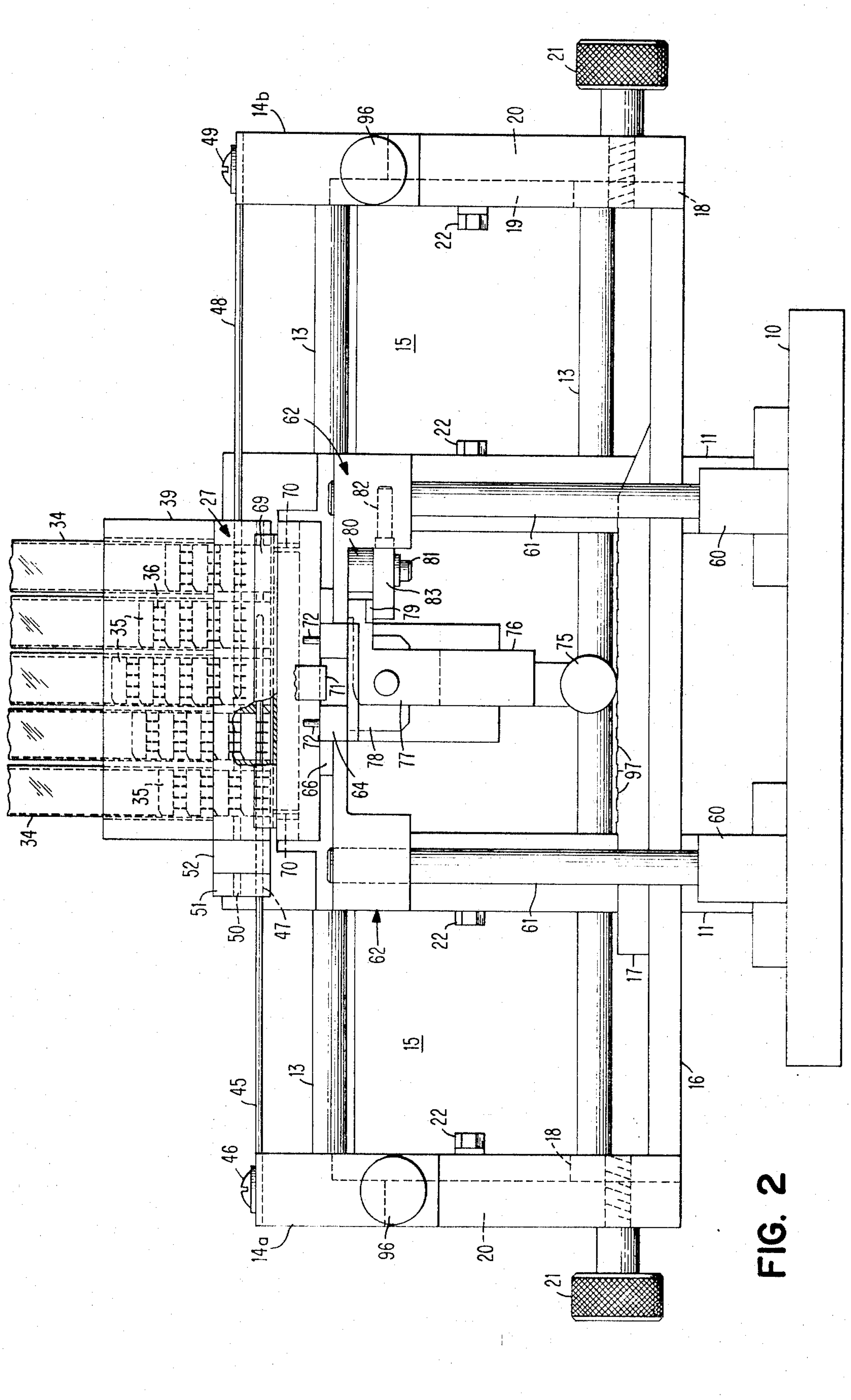
FIG. 2 is a front elevation view, partially in section, of the apparatus shown in FIG. 1.

Referring to FIGS. 1 and 2, a base 10 has secured thereto a pair of upright posts 11 each having bearings 12 extending therethrough to support two horizontally, bi-directionally movable rods 13 which support spaced end plates **14*a* and 14*b*. The rods 13 can move to the limits permitted by adjustable end plate stops 22 on both posts 11 and end plates 14*a*, 14*b*. A rear bar 15 is fastened between the two end plates to add rigidity to this movable assembly. Also extending between end plates 14*a*, 14*b* is a support bar 16 for cam 17 with the support bar having fixedly secured end portions 18 thereon and vertically adjustable end respective recesses 19. Each end plate has a slot 20 through the plate at the inner surface of the recess through which a knurled adjustment knob 21 threadedly engages each end portion 18. Cam support bar 16 can be adjusted to a selected vertical position by thus loosening the pair of knobs 21 and moving the bar and attached end portions 18** in the recesses, and retightening the knobs.

Secured near the top of upright posts 11 is an interconnecting flat bar 26 which supports a guide assembly 27 that is comprised of intersecting cross members 28 to form openings corresponding to the cross-sectional configuration of the electrical components to be inserted. In the embodiment shown, there are 20 openings arranged in a four by five matrix. It will be noted that this number and arrangement can be changed as required for the circuit panels to be assembled. Also with this particular embodiment, the components each have identical external size and configuration so that an "egg crate" effect is the result. The cross members can be formed by cutting opposing slots half way through the vertical dimension of the members at each intersection as is commonly known. Accuracy and rigidity of the cross members is obtained by subsequent welding. The member thickness is minimized to expose as much panel surface thereunder as possible. In each opening the wall area of members 28 near each corner 29 is recessed to allow non-uniform component corners to slide freely through the guide assembly. The resulting raised portions 30 are accurately dimensioned to align the component with its selected panel holes.

Supported atop guide 27 is a magazine holder assembly 32 which has a similar "egg crate" appearance because of the arrangement of partitions 33 to hold magazines 34 which, in turn, contain stacks of supply components 35. Components 35 each have depending leads 36. The magazine holder has locating holes 37 therein which allow the holder assembly to be precisely positioned by locating pins 38. Holder 32 can be constructed, for example, by forming a frame 39 of metal and using castable plastic material to form partitions 33 by means of a mold. Suitable magazines can be made of extruded plastic or metal materials. Often the magazines can serve also as shipping containers for the components to be inserted. Holder 32 rests on guide assembly 27 with the magazines frictionally held in place and aligned so that the components can readily slide from the magazines into the respective openings of the guide assembly.

Components are dispensed from the magazines singly by an escapement means comprising two sets of parallel rods horizontally movable through holes in members 28 that are normal thereto. A lower set of rods is the group of rod pairs 45 secured to end plate 14*a* by screws 46 and extending into respective lower pairs of holes 47 in the guide members. An upper set of rods is the group of rod pairs 48 secured to end plate 14*b* by screws 49 and extending into upper pairs of holes 50 in the guide members. The rod sets are spaced vertically from each other slightly less than the height of an individual component in the magazine.

An auxiliary rod guide 51 is attached with spacers 52 to the left side of guide 27 to support lower sets of rods 45 when withdrawn from the last, adjacent end member 28 of the guide. Additional leftward travel is required in order to allow cam 17 to lower a circuit panel holder 65 only after any component in the leftmost opening has been released. Holes 50, of course, are also provided for upper sets of rods 48. The arrangement and movement of the circuit panel holder 65 will be described below.

Rods 45 and 48 of each set are at least of a length sufficient to extend across all openings in guide 27 aligned therewith when the respective attached end plate 14*a* or 14*b* is in its position closest to the guide. It is preferable that the rods in each set overlap their free ends by an additional amount equal approximately to the width of a guide opening. Holes 47 and 50 in guide members 28 are spaced so that the rods moving freely therein pass between leads 36 depending from the components 35 (FIG. 3).

Referring again to FIGS. 1 and 2, the circuit panels that are to receive components are supported underneath the guide 27 by panel registration means comprising generally a pair of brackets 60 secured to base 10 and fixedly supporting four upright rods 61 on which a bracket 62 is freely vertically movable via holes 63. Bracket 62 has formed thereon two spaced guides 64 along which a removable panel holder 65 can move, held in place by rails 66 secured thereunder, adjacent guides 64. This arrangement allows the panel holder to move back and forth on bracket 62. Holder 65 is cut out at recess 67 to conform to the lower surface configuration of a circuit panel 68, as required such as for terminal block 69 shown. As can best be seen in FIG. 2, the holder can also have alignment pins 70 secured thereto by which a panel can be accurately inserted. A handle 71 is also attached to the panel holder 65 for convenience of moving the holder under the guide. The holder can be limited in its insertion travel by a stop (not shown) on bar 26. Travel on removal is limited by stop 72 on bracket 62.

When panel holder 65 is in the inserted position, it and the panel thereon are raised toward guide 27 by the movement of bracket 62 through the action of a cam follower 75 on cam 17. This movement is produced by cam 17 moving under follower 75 as end plates 14*a*, 14*b* on bars 13 are moved toward the right of FIG. 1. Return movement of the end plate assembly to the left, of course, lowers bracket 62.

Cam follower 75 is mounted on bracket 62 for release, in order to lower the bracket sufficiently to allow operator access to the bottom of guide 27, the escapement rods 45, 48, and the lower end of magazines 34, if required. Follower 75 is mounted on arm 76 which can pivot clockwise on pin 77 extending from depending tab 78 on bracket 62 (FIG. 2). The arm has an ear 79 integral therewith which abuts the underside of the bracket as shown. The ear is held in this position by clamp 80 rotatable on stud 81 by handle 82. The clamp is cut away at surface 83 so that when partially rotated to bring surface 83 adjacent ear 79, the ear is unrestricted and arm 76 can be swung to the left.

Magazines 34 having components 35 therein can be conveniently placed in holder assembly 32 by removing the assembly from the insertion apparatus to a loading pan 90 such as shown in FIG. 4. An operator can insert filled magazines in selected openings between partitions 33 corresponding to the circuit panel location that is to receive those components. The pan has retaining sides 91 and handle 92. Cutouts 93 are provided to avoid interference with alignment pins 38 on the insertion apparatus. After magazines are in place, the pan and holder together can be lowered on pins 38 until the pan rests on guide 27. Thereafter, the pan is withdrawn allowing the components to move downwardly onto either the lower or upper set of escapement rods 45, 48. The pan can alternatively be formed with parallel rods for its bottom to replace the solid sheet material. The rods would be spaced to pass between component leads and allow the pan to be inserted under the holder when its removal with filled or partially filled magazines is necessary.

The operation of the insertion apparatus will be described with reference to FIGS. 1 and 2. Preferably before loading the magazines and holder on guide 27, an operator moves the end plate assembly to the extreme left by grasping one of two handles 96, partially shown, thereafter the magazines and holder are moved into place on pins 38 and pan 90 is withdrawn. Removal of the pan allows the components in each of the magazines to move downward until the leads of the bottom-most components 35 straddle the upper set of escapement rods 48 which prevent further movement of the components. Panel holder 65 is then drawn back from guide 27 and a circuit panel 68 is inserted in the holder which is thereafter returned to a position underneath guide 27. The operator now grasps one or both of the handles 96 and moves the end plate assembly toward the right causing cam 17 to move under follower 75 thus raising bracket 62 and panel holder 65 with panel 68 thereon toward guide assembly 27. Continued movement of the end plate assembly toward the right then causes withdrawal to the right of the upper escapement rods 48 and insertion of the lower set of escapement rods 45 under the various magazines in holder 32. As the upper rods are withdrawn, the components fall nearly the height of a component onto the lower set of rods and remain in that position as the lower rods continue to move toward the right. Upon completion of the rightward movement, the end plate assembly is reversed causing the lower sets of rods 45 to withdraw from the components, but concurrently inserting the upper sets of rods 48 beneath the components resting atop the respective bottom components in the magazines. As the lower rods withdraw from each opening, any component therein will drop through its respective guide opening 27 onto the circuit panel therebelow with the leads 36 entering corresponding holes in the circuit panel at each location that is to receive a component. In the embodiment shown, the effective surface of cam 17 has slight depressions 97 formed therein to produce vibrations to aid in seating the components.

At the conclusion of the leftward movement, one component from each magazine is thus freed to fall onto the circuit panel below. When the end plate assembly has reached its left extreme of travel, cam follower 75 no longer rests on cam 17 so that bracket 62 with the panel and panel holder thereon are lowered to their initial inserted position. The lowering of the panel allows the panel holder to be withdrawn and also allows the now-inserted modules to pass under the guide 27. Upon retraction of panel holder 65, the assembled panel and components can be removed from the holder and further processed, for example, to secure the leads of the components in the panel.

It will be apparent that the size of the magazine matrix can be constructed for inserting larger numbers of components in larger panels. Also, by using a larger matrix, a plurality of small circuit panels can be positioned on a common panel holder so that the components are inserted in several panels during a single insertion cycle. Additional magazine holders can be provided and filled by another operator while the insertion apparatus is being used.

In certain instances, components may be required to abut one another sufficiently closely on the panel so that the two magazines cannot be properly positioned to permit correct insertion. The thickness of the cross members in guide 27 or partitions 33 in the magazine holder may, in such instance, be the limiting structure. To overcome this situation, a second apparatus can be constructed or another guide and magazine holder built for the first apparatus to accommodate the required component positioning. Assembly would then be accomplished in two steps, one being to partially complete the panel, and the second to insert the additional components in the partially completed panel in the second apparatus or modified first apparatus. The disclosed device can accommodate partially complete panels by adjusting cam support bar 16 to a lower level with knobs 21 so that the components on the partially complete panel will not interfere with the bottom of guide 27 when the panel holder 65 and support bracket 62 are raised by the cam action.

While the invention has been particularly shown and described with reference to a preferred embodiment thereof, it will be understood by those skilled in the art that the foregoing and other changes in form and detail may be made therein without departing from the spirit and scope of the invention.

What is claimed is:

1. Apparatus for inserting multi-lead electrical components in a perforated circuit panel comprising:
   dispensing means having supported thereon a plurality of component magazines and operable in one cycle to release single components with said leads foremost from each of said magazines;
   registration means connected to and operable with said dispensing means for moving said panel from a first position to a component-receiving position; and
   guide means between said dispensing means and said panel in said component-receiving position for directing each of said released components to predetermined groups of perforations in said panel for insertion of its said leads.

2. Apparatus for inserting electrical components in a circuit panel comprising:
   guide means for directing said components to predetermined aligned positions on said panel;
   storage means for supporting pluralities of components at selected ones of said panel positions in alignment with said guide means;
   escapement means operable to release from said storage means a single component in each of said pluralities for movement along said guide means for insertion; and
   registration means operable by said escapement means to move said panel from an initial position to a component-receiving position adjacent said guide means.

3. Apparatus for inserting electrical components in a circuit panel comprising:
   a plurality of supply magazines each holding a plurality of components therein in stacked relation;
   means for removably supporting each of said magazines in prescribed relation with each other;
   circuit panel holding means for movably positioning said panel between an initial loading position and a position with selected areas thereof aligned beneath respective magazines for receiving said components; and component release means operable to release a single component from each of said magazines for movement to said selected areas on said panel.

4. Apparatus as described in claim 1 wherein said dispensing means includes:

a plurality of magazines each containing a stack of said components;

support means for removably holding said magazines in alignment with selectable ones of said groups of perforations; and means for moving a component from each of said stacks to an intermediate position prior to the release of any of said components.

5. Apparatus as described in claim 2 wherein said escapement means is operable to release a plurality of said single components simultaneously into said guide means.

6. Apparatus for inserting multi-lead components in a perforated circuit panel comprising:

supply means for removably holding a plurality of magazines in preselected positions therein, each said magazine holding a plurality of said components in stacked relation;

escapement means cyclically operable for moving a single component with said leads foremost from each said magazine to an intermediate position during a first portion of said cycle and releasing said components during a second portion of said cycle;

guide means for directing components released by said escapement means to predetermined groups of perforations in a said panel; and support means operable by said escapement means for moving a panel thereon from a first position to a component-receiving position with groups of perforations therein aligned in said guide means for insertion of said component leads.

7. Apparatus as described in claim 6 wherein said support means includes a cam follower and said escapement means includes a cam having a surface engageable with said follower.

8. Apparatus as described in claim 7 wherein said cam surface includes irregularities thereon for creating vibrations in said support means while in said component-receiving position.

9. Apparatus as described in claim 6 wherein said escapement means includes parallel groups of rods on different planes spaced apart a distance less than the normal dimension of a component supported thereby.

10. Apparatus as described in claim 7 wherein said cam follower is disengageable from said cam to permit said support means to move to provide access to said guide means.

* * * * *